(12) United States Patent
Echizen et al.

(10) Patent No.: US 9,312,289 B2
(45) Date of Patent: Apr. 12, 2016

(54) PHOTOELECTRIC CONVERSION APPARATUS, MANUFACTURING METHOD THEREOF, AND IMAGE PICKUP SYSTEM

(71) Applicant: CANON KABUSHIKI KAISHA, Tokyo (JP)

(72) Inventors: Hiroshi Echizen, Kawasaki (JP); Mineo Shimotsusa, Machida (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/739,854

(22) Filed: Jun. 15, 2015

(65) Prior Publication Data

US 2015/0364511 A1     Dec. 17, 2015

(30) Foreign Application Priority Data

Jun. 16, 2014  (JP) ................. 2014-123832

(51) Int. Cl.
*H01L 27/00*     (2006.01)
*H01L 27/146*    (2006.01)

(52) U.S. Cl.
CPC ...... *H01L 27/14605* (2013.01); *H01L 27/1463* (2013.01); *H01L 27/14623* (2013.01); *H01L 27/14625* (2013.01); *H01L 27/14643* (2013.01); *H01L 27/14685* (2013.01)

(58) Field of Classification Search
CPC ............... H01L 27/14605; H01L 27/1463; H01L 27/14625; H01L 27/14623; H01L 27/14685; H01L 27/14643
See application file for complete search history.

(56) References Cited

U.S. PATENT DOCUMENTS

| | | | | |
|---|---|---|---|---|
| 7,245,324 B2 * | 7/2007 | Namazue | .......... | H01L 27/14621 257/436 |
| 8,229,255 B2 * | 7/2012 | Wober | ................ | G02B 6/4204 250/227.11 |
| 8,817,144 B2 * | 8/2014 | Kato | ................ | H01L 27/14627 257/290 |
| 9,094,624 B2 * | 7/2015 | Shimotsusa | ....... | H01L 27/14627 |
| 2010/0078744 A1 * | 4/2010 | Wano | ................ | H01L 27/14629 257/432 |

FOREIGN PATENT DOCUMENTS

| | | | |
|---|---|---|---|
| JP | 2005-322888 A | 11/2005 | |
| JP | 2009-158800 A | 7/2009 | |
| JP | 2012-199301 A | 10/2012 | |
| JP | 2013-045907 A | 3/2013 | |

* cited by examiner

*Primary Examiner* — Nikolay Yushin
(74) *Attorney, Agent, or Firm* — Canon USA Inc. IP Division

(57) ABSTRACT

A light guide portion includes a low refractive index portion and a high refractive index portion. The low refractive index portion has a refractive index equal to or lower than that of an insulating layer. The high refractive index portion has a refractive index higher than that of the low refractive index portion. The low refractive index portion is located above a separating portion, and is sandwiched by the high refractive index portion in a first direction. A width in the first direction of the low refractive index portion at a first position distant from the separating portion in a second direction is narrower than a width in the first direction of the low refractive index portion at a second position closer to the separating portion than the first position in the second direction.

9 Claims, 6 Drawing Sheets

PHOTOELECTRIC CONVERSION APPARATUS, MANUFACTURING METHOD THEREOF, AND IMAGE PICKUP SYSTEM

BACKGROUND OF THE INVENTION

1. Field of the Invention

The present technology relates to a light-receiving element apparatus including a light guide unit.

2. Description of the Related Art

A photoelectric conversion apparatus that performs focus detection by detecting a phase difference using a pixel having a plurality of photoelectric conversion units has been proposed. A configuration in which a single pixel has a plurality of photoelectric conversion units is advantageous in improving performance of an image pickup system, including speeding up by improvement in transfer efficiency and an increase in dynamic range, in addition to the focus detection.

Japanese Patent Laid-Open No. 2009-158800 discloses a solid-state image pickup element in which a gap is formed in an interlayer film formed on a substrate along a parting line that divides a first photoelectric conversion unit and a second photoelectric conversion unit.

In the form disclosed in Japanese Patent Laid-Open No. 2009-158800, loss of incident light is large and sufficient sensitivity is not obtained.

SUMMARY OF THE INVENTION

The present disclosure is a photoelectric conversion apparatus including a light-receiving element, the light-receiving element including: a first photoelectric conversion unit and a second photoelectric conversion unit; a separating portion located between the first photoelectric conversion unit and the second photoelectric conversion unit; and a light guide portion surrounded by an insulating film including at least one insulating layer, and provided to extend over the first photoelectric conversion unit and second photoelectric conversion unit, wherein when a direction in which the first photoelectric conversion unit and the second photoelectric conversion unit are arranged is defined as a first direction, and a direction in which the first photoelectric conversion unit and the second photoelectric conversion unit, and the light guide portion are arranged is defined as a second direction, the light guide portion includes a low refractive index portion and a high refractive index portion, the low refractive index portion having a refractive index equal to or lower than a refractive index of the insulating layer, and the high refractive index portion having a refractive index higher than a refractive index of the low refractive index portion, the low refractive index portion is located above the separating portion, and is sandwiched by the high refractive index portion in the first direction, and a width in the first direction of the low refractive index portion at a first position distant from the separating portion in the second direction is narrower than a width in the first direction of the low refractive index portion at a second position closer to the separating portion than the first position in the second position.

Further features of the present invention will become apparent from the following description of exemplary embodiments with reference to the attached drawings.

DESCRIPTION OF THE EMBODIMENTS

Figure 1A:
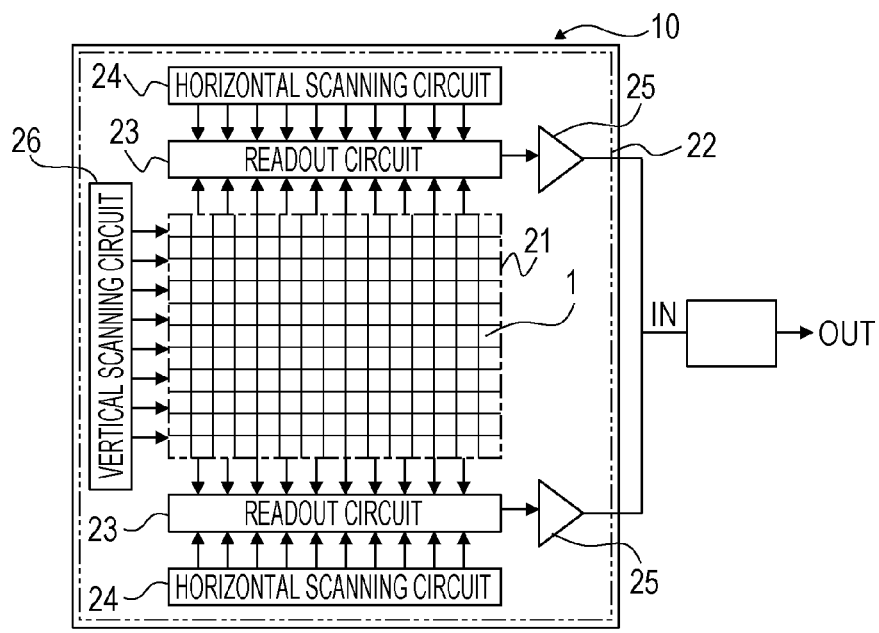
FIGS. 1A to 1C are schematic diagrams illustrating a photoelectric conversion apparatus.

Hereinafter, an embodiment for implementing the present invention is described with reference to the drawings. The embodiment described below is illustrative only and not restrictive. In the following description and drawings, configurations common among a plurality of drawings are denoted by the same reference numerals. Configurations common among a plurality of drawings are mutually referred to one another, and description of the configurations denoted by the same reference numerals is omitted. Any suitable technique is applicable to the matters that are not described herein.

FIG. 1A schematically illustrates a photoelectric conversion apparatus 10 as a pixel amplified image sensor. The photoelectric conversion apparatus 10 illustrated in FIG. 1A includes a light receiving region 21, which is a region surrounded by a dashed line, and a peripheral region 22, which is a region between the dashed line and a two-dot chain line and is a peripheral region of the light receiving region 21. In the light receiving region 21, a plurality of light-receiving elements 1 are arranged in a matrix pattern or in arrays. The light receiving region 21 may also be referred to as an image pickup region or a pixel region. A distance (i.e., a pixel pitch) between central axes of adjoining light-receiving elements is typically equal to or shorter than 10 µm and desirably equal to or shorter than 5.0 µm.

The peripheral region 22 includes a vertical scanning circuit 26, two readout circuits 23, two horizontal scanning circuits 24, and two output amplifiers 25. Each readout circuit 23 of the peripheral region 22 is constituted by, for example, a column amplifier, a correlated double sampling (CDS) circuit, and an adder circuit. The readout circuit 23 amplifies, adds, and the like signals read from pixels of a row selected by the vertical scanning circuit 26 via vertical signal lines. The column amplifier, the CDS circuit, the adder circuit, and the like are provided, for example, for each pixel array or for a plurality of pixel arrays. The horizontal scanning circuit 24 generates signals for sequentially reading signals of the readout circuit 23. The output amplifier 25 amplifies and outputs the signals in a column selected by the horizontal scanning circuit 24. The above configuration of the photoelectric conversion apparatus 10 is illustrative only and not restrictive. The readout circuits 23, the horizontal scanning circuit 24, and the output amplifier 25 constitute two output paths, one of which is disposed above the light receiving region 21 and the other of which is disposed below the light receiving region 21. But this configuration is not restrictive.

Figure 1B:
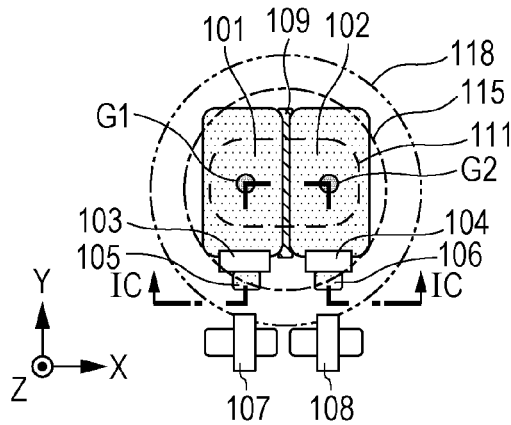
Figure 1C:
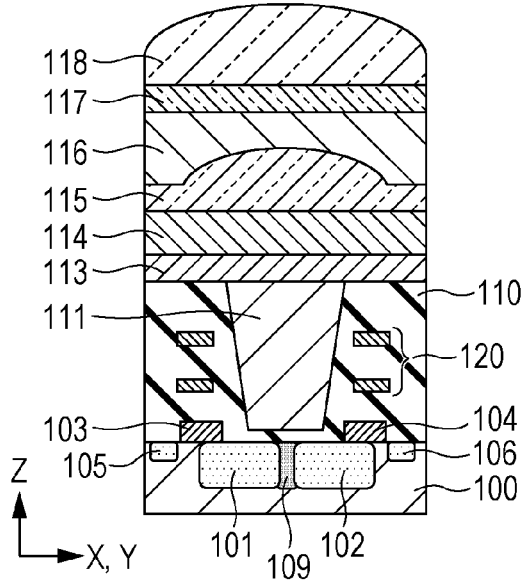

FIG. 1B is a schematic plan view illustrating an exemplary light-receiving element 1, and FIG. 1C is a schematic sectional view of a light-receiving element 1 along line IC-IC of FIG. 1B. Each light-receiving element 1 is provided with a plurality of photoelectric conversion units 101 and 102 disposed inside a substrate 100 formed by a semiconductor. A separating portion 109 for separating signal charge is provided between the photoelectric conversion units 101 and 102. The separating portion 109 may be insulated separation made by an insulating material, such as LOCOS or STI, or may be junction isolation made by a semiconductor region of opposite conductivity to those of the accumulation regions of the photoelectric conversion units 101 and 102. In this embodiment, junction isolation is employed. Separation performance of the separating portion 109 is not necessarily perfect: it is sufficient that the separation portion 109 may determine whether signal charge generated by the photoelectric conversion unit 101 or 102 is large or small. Therefore, it is allowable that a part of the signal charge generated by the photoelectric conversion unit 101 is detected by a detection unit as signal charge generated by the photoelectric conversion unit 102.

The photoelectric conversion units 101 and 102 of each of a plurality of light-receiving elements 1 are arranged on a principal surface of the substrate 100 that is used as an image pickup surface in a common substrate 100. A part of the image pickup surface corresponds to the light-receiving surfaces of the photoelectric conversion units 101 and 102. The light-receiving surfaces of the photoelectric conversion units 101 and 102 may be a part of the surface of the substrate 100. A direction parallel to the image pickup surface or the light-receiving surface, and in which the two photoelectric conversion units 101 and 102 are arranged via the separating portion 109 is defined as an X direction. The direction in which the two photoelectric conversion units 101 and 102 are arranged may be defined as a direction parallel to a straight line connecting a geometric center of gravity G1 of the photoelectric conversion unit 101 when seen as a plan view and a geometric center of gravity G2 of the photoelectric conversion unit 102 when seen as a plan view. A direction parallel to the image pickup surface and vertical to the X direction is referred to as a Y direction. Typically, the X direction may be one of a row direction (i.e., a direction in which a row extends) or a column direction (i.e., a direction in which a column extends) of the light-receiving elements 1 that are arranged in a matrix pattern in the light receiving region 21. Typically, the Y direction may be the other of the row direction (i.e., a direction along the row) or the column direction (i.e., a direction along the column) of the light-receiving elements 1 that are arranged in a matrix pattern in the light receiving region 21.

The photoelectric conversion units 101 and 102 of the present embodiment are photodiodes formed by introducing impurities in the substrate 100. The photoelectric conversion units 101 and 102 as photodiodes use signal charge as a majority carrier, and are formed by a p-n junction of a first conductive semiconductor region (i.e., an accumulation region) in which signal charge is accumulated, and a second conductive semiconductor region. Alternatively, each of the photoelectric conversion units 101 and 102 may be a photogate or may be formed as a semiconductor film having an MIS structure or a PIN structure on a substrate formed by an insulating material, such as glass. In the light receiving region 21 of the photoelectric conversion apparatus 10, a light-receiving element including only one photoelectric conversion unit in addition to the light-receiving element 1 may be included.

The signal charge obtained in the photoelectric conversion unit 101 is transferred to a detection unit 105 via a transfer gate 103 that has an MOS structure. The signal charge obtained in the photoelectric conversion unit 102 is transferred to a detection unit 106 via a transfer gate 104 that has an MOS structure. The detection units 105 and 106 for example include a floating diffusion unit having certain electric capacity and may detect an amount of charge by converting an amount of signal charge into a voltage. The detection units 105 and 106 are connected to an amplifying transistor 107 and a reset transistor 108, respectively. Here, the detection unit 105 is provided for the photoelectric conversion unit 101 and the detection unit 106 is provided for the photoelectric conversion unit 102 so that signal charge is transferred in parallel from separate photoelectric conversion units 101 and 102. Alternatively, when the signal charge is transferred serially from the separate photoelectric conversion units 101 and 102 using the separate transfer gates 103 and 104, a common detection unit may be used.

By disposing a plurality of light-receiving elements 1 in the light receiving region 21 of the photoelectric conversion apparatus 10 illustrated in FIG. 1A, focus detection (AF) can be performed in the image pickup region through phase difference detection. This embodiment is applicable to an image pickup system (i.e. a camera) that performs distance measurement using phase difference detection. Further, image pickup may be performed using signals of at least one of a plurality of photoelectric conversion units 101 and 102 output from the light-receiving element 1 as image pickup signals. For example, signals of the photoelectric conversion units 101 and 102 can be added together to obtain an image pickup signal. Thus, the photoelectric conversion apparatus 10 of the present embodiment may implement an image surface phase difference AF by using signals of the photoelectric conversion units 101 and 102 for both focus detection and image pickup.

An insulating film 110 is provided on the substrate 100. The insulating film 110 may be transparent. The insulating film 110 may be a single layer film made of a single kind of material, but typically is a multilayer film formed by a plurality of laminated insulating layers made of different materials. A certain insulating layer of the insulating film 110 is made for example of silicon oxide ($SiO_2$). Another insulating layer may be made for example of silicate glass, such as boron phosphorus silicate glass (BPSG), phosphorus silicate glass (PSG), and boron silicate glass (BSG). A certain insulating layer of the plurality of films that constitute the insulating film 110 may be made of silicon nitride ($Si_3N_4$) or silicon carbide (SiC). A wiring 120 may be provided inside the insulating film 110. The wiring 120 may be a multi-layer wiring to which a plurality of wiring layers are connected via plugs. In the example of FIG. 1C, the wiring 120 is formed in two layers, but the wiring 120 may be formed in three or more layers. The wiring 120 may be made of a conductive material, such as copper, aluminum, tungsten, tantalum, titanium, and polysilicon.

The light-receiving element 1 includes at least one light guide portion 111, and the single light guide portion 111 is provided to extend over a plurality of photoelectric conversion units 101 and 102. The light guide portion 111 is disposed next to the photoelectric conversion units 101 and 102 in a Z direction. The Z direction may be a direction vertical to the image pickup surface. The Y direction vertically crosses the X direction and the Z direction. The light guide portion 111 encloses light incident on the light guide portion 111, and causes the enclosed light to propagate to the photoelectric conversion units 101 and 102.

The light guide portion 111 is surrounded by the insulating film 110. That is, the insulating film 110 is located on the periphery of the light guide portion 111 on an XY plane. By causing the refractive index of the light guide portion 111 to be different from the refractive index of the insulating film 110, light incident on the light guide portion 111 can be guided to the photoelectric conversion units 101 and 102 by the reflection on an interface between the light guide portion 111 and the insulating film 110. By setting the refractive index of the light guide portion 111 to be higher than the refractive index of the insulating film 110, total reflection can be generated and reflection efficiency can be improved.

Further, the light guide portion 111 may be surrounded by a low refractive index region (e.g., an air gap) of which refractive index is lower than those of the light guide portion 111 and the insulating film 110. In this configuration, light incident on the light guide portion 111 can be guided to the photoelectric conversion units 101 and 102 by total reflection on the interface between the light guide portion 111 and the low refractive index region. Alternatively, side surfaces of the light guide portion 111 may be surrounded by a reflector, such as metal. In this configuration, light incident on the light guide portion 111 can be guided to the photoelectric conversion units 101 and 102 by metal reflection. When the low refractive index region or a reflector is provided, the refractive index of the light guide portion 111 may differ from or may be the same as the refractive index of the insulating film 110.

The light guide portion 111 may be made of an organic material (i.e., resin) or an inorganic material. It is desirable to select a material having high transmittance and a high refractive index in visible light regions. From the viewpoint of reliability, moisture resistance and shock resistance are also necessary. When these are considered, siloxane-based resin and polyimide-based resin are employed as resin. Desirable inorganic materials include silicon nitride ($Si_XN_Y$), silicon oxynitride ($Si_XO_YN_Z$), titanium oxide ($TiO_2$), and aluminum oxide ($Al_2O_3$). Among these, silicon nitride, which is easily fabricated by plasma CVD and heat CVD, is especially desirable. The light guide portion 111 may be made of a single material, or a plurality of materials.

The refractive indices of the materials listed as materials of the light guide portion 111 and the insulating film 110 are as follows: silicon oxide: 1.4 to 1.5, silicon oxynitride: 1.6 to 1.9, silicon nitride: 1.8 to 2.3, titanium oxide: 2.5 to 2.7, and BSG, PSG, and BPSG: 1.4 to 1.6. These values are illustrative only, and the refractive index may be determined suitably because even the same material has different composition ratio, density or void ratio when formed by a different film formation method. The refractive index of typical resin is 1.3 to 1.6, and the refractive index of high refractive index resin is 1.6 to 1.8. However, by causing the high refractive index inorganic materials, such as metal oxide, to be contained, the effectual refractive index can be increased greater than that of the resin. Examples of the high refractive index inorganic material to be contained in the resin include titanium oxide, tantalum oxide, niobium oxide, tungsten oxide, zirconium oxide, zinc oxide, indium oxide, and hafnium oxide.

Another configuration of the light-receiving element 1 is described, but any modification can be made thereto. A high refractive index film 113 is provided to extend over the light guide portion 111 and the insulating film 110. The high refractive index film 113 has a refractive index higher than the refractive index of the insulating film 110. The high refractive index film 113 can be made of the same material as that of the light guide portion 111. In that case, a boundary between the high refractive index film 113 and the light guide portion 111 is considered to be located at the same height as that of an upper surface of the insulating film 110.

An innerlayer lens 115 is provided above the high refractive index film 113 via the low refractive index film 114. If the innerlayer lens 115 is not provided, a flat passivation film may be disposed at the position of the innerlayer lens 115 instead thereof. The low refractive index film 114 has a refractive index lower than at least one of the refractive index of the innerlayer lens 115 and the refractive index of the high refractive index film 113 (or the light guide portion 111). The low refractive index film 114 may have any one of a function to adjust the distance between the innerlayer lens 115 and the light guide portion 111, a function to planarize, and a function to condense light by refraction of light. On the innerlayer lens 115, a wavelength selection unit 117 is provided via a planarizing film 116. The wavelength selection unit 117 is a color filter or a dichroic mirror, which has a different wavelength transmission property for each light-receiving element of the light receiving region 21 in accordance with, for example, the Bayer array. On the wavelength selection unit 117, a condensing portion 118 formed as a microlens is disposed. Each of a single light guide portion 111, a single innerlayer lens 115, a single wavelength selection unit 117, and a single condensing portion 118 corresponds to a plurality of photoelectric conversion units 101 and 102.

In the following description, the "refractive index of the insulating film 110" is described as a refractive index of a certain insulating layer of the insulating film 110. The "refractive index of the light guide portion 111" is described as a refractive index of a material which forms a certain portion of the light guide portion 111. The refractive index of a certain portion of the light guide portion 111 is higher than the refractive index of a certain insulating layer of the insulating film 110. The insulating film 110 may include an insulating layer having a refractive index higher than a refractive index of a certain portion of the light guide portion 111. It is desirable that the refractive index of the most part of the insulating film 110 is higher than the refractive index of the most part of the light guide portion 111. It is desirable that the insulating layer having a refractive index higher than the refractive index of a certain portion of the light guide portion 111 is thinner than the insulating layer having a refractive index lower than the refractive index of a certain portion of the light guide portion 111.

In the present disclosure, the "refractive index" refers to an absolute index. The refractive index varies depending on the wavelengths, but herein is a refractive index corresponding to a wavelength of light that may at least generate signal charge in the photoelectric conversion unit 101. The refractive index is desirably based on a wavelength of light photoelectrically converted in the largest amount in the photoelectric conversion unit. When the photoelectric conversion apparatus 10 includes a wavelength selection unit, such as a color filter, it is more desirable to use a wavelength of light which has passed through the wavelength selection unit, especially the main transmission wavelength. It is especially desirable to use the light-receiving element 1 provided with a green color filter having a peak near 550 nm as a reference. The selectivity of the wavelength selection unit is not necessarily perfect. Specifically, transmittance of the wavelength selected by the wavelength selection unit may be less than 100%, and transmittance of the wavelength not selected by the wavelength selection unit does not necessarily have to be 0%.

Figure 2:
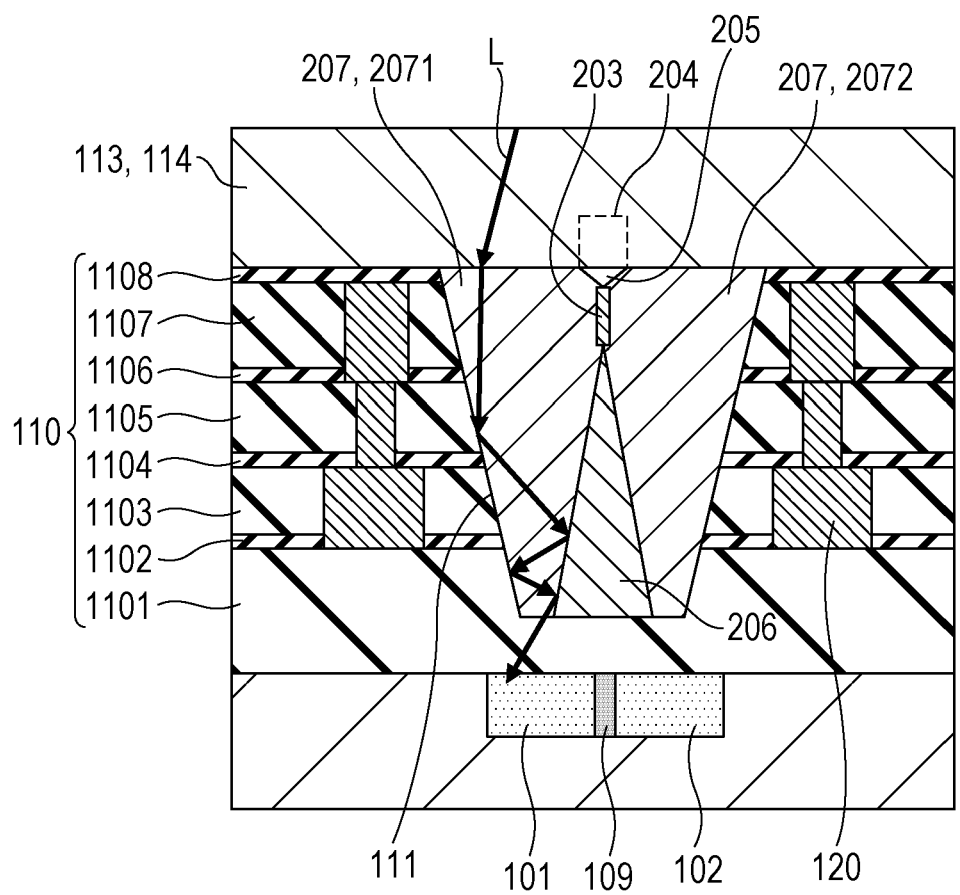
FIG. 2 is a schematic diagram illustrating a light-receiving element.

Referring to FIG. 2, a desired configuration of the light guide portion 111 is described in detail. As illustrated in FIG. 2, the insulating film 110 is formed by alternately laminated low refractive index insulating layers 1101, 1103, 1105, and 1107 and high refractive index insulating layers 1102, 1104, 1106, and 1108. The low refractive index insulating layers 1101, 1103, 1105, and 1107 function as inter-layer insulating layers of the wiring 120 formed by a plurality of wiring layers, and are made of a silicon oxide-based material. The high refractive index insulating layers 1102, 1104, 1106, and 1108 function as diffusion prevention layers of copper contained in the wiring 120, and are made of a silicon nitride-based material or a silicon carbide-based material. The low refractive index insulating layers 1101, 1103, 1105, and 1107 are lower in refractive index and higher in thickness than adjoining high refractive index insulating layers 1102, 1104, 1106, and 1108, respectively.

The light guide portion 111 is surrounded by each insulating layer of the insulating film 110. The light guide portion 111 includes a low refractive index portion 206 and a high refractive index portion 207. The refractive index of the high refractive index portion 207 is higher than the refractive index of the low refractive index portion 206.

The high refractive index portion 207 which forms the light guide portion 111 may have a refractive index higher than those of the low refractive index insulating layers 1101, 1103, 1105, and 1107 surrounding the high refractive index portion 207. Thus, total reflection can be produced on an interface between the low refractive index insulating layers 1101, 1103, 1105, and 1107 and the high refractive index portion 207. The refractive index of the high refractive index insulating layers 1102, 1104, 1106, and 1108 may be higher than the refractive index of the high refractive index portion 207. As described above, the light guide portion 111 may be formed also by providing a low refractive index region having a refractive index lower than that of the high refractive index portion 207 or that of the insulating film 110, and providing a reflector between the high refractive index portion 207 and the insulating film 110. In that case, it is not necessary to set the refractive index of the high refractive index portion 207 to be higher than the refractive index of the insulating film 110.

The high refractive index portion 207 of the light guide portion 111 is located above a plurality of photoelectric conversion units 101 and 102. The high refractive index portion 207 located above the photoelectric conversion unit 101 and the high refractive index portion 207 located above the photoelectric conversion unit 102 may or may not continue with each other.

The low refractive index portion 206 is located above the separating portion 109. The low refractive index portion 206 may have a refractive index that is equal to or smaller than that of the insulating film 110. The refractive index of the low refractive index portion 206 is lower than the refractive indices of the high refractive index insulating layers 1102, 1104, 1106, and 1108, and is lower than the refractive indices of the low refractive index insulating layers 1101, 1103, 1105, and 1107. The low refractive index portion 206 may be solid or liquid, but desirably gas or a vacuum space. The refractive index in the visible light region of the low refractive index portion 206 as gas or a vacuum space is 1.0. Therefore, the low refractive index portion 206 as gas or a vacuum space can have a refractive index sufficiently lower than that of the insulating film 110 formed by an insulating layer having a refractive index in a range of 1.4 to 2.4 in a visible light region. Light may propagate inside the low refractive index portion 206, but the amount of the light propagating inside the low refractive index portion 206 is very small or zero. However, existence of the low refractive index portion 206 is very important regarding the control of the behavior of light inside the light guide portion 111.

The high refractive index portion 207 is located on both sides of the low refractive index portion 206 in the X direction in which the photoelectric conversion units 101 and 102 are arranged next to each other. In particular, the high refractive index portion 207 includes, as a part thereof, a first portion 2071 and a second portion 2072. The first portion 2071 is located above the photoelectric conversion unit 101. The second portion 2072 is located above the photoelectric conversion unit 102. Thus, the low refractive index portion 206 is disposed between the first portion 2071 and the second portion 2072. That is, since each of the first portion 2071 and the second portion 2072 functions as the light guide portion 111, the low refractive index portion 206 is sandwiched by the high refractive index portion 207 of the light guide portion 111 in the X direction. The shape of the first portion 2071 and the second portion 2072 may be plane symmetry about an Y-Z surface defined on the separating portion 109.

The low refractive index portion 206 has a shape extending in the Z direction. The width of the low refractive index portion 206 in the X direction is narrowed as it becomes distant from the separating portion 109 in the Z direction.

The shape of the low refractive index portion 206 is described in more detail with reference to FIG. 3. Positions in the Z direction (i.e., heights from the separating portion 109) are shown by H1, H2, H3, and H4 in FIG. 3. H1 is the height near an incidence end 201 of the light guide portion 111. H2 and H3 are the heights between the incidence end 201 and emission end 202 of the light guide portion 111. H4 is the height near the emission end 202 of the light guide portion 111. Distance relationship of H1 to H4 from the separating portion 109 is H1>H2>H3>H4. Cross-sectional shapes of surfaces vertical to the Z direction of light-receiving element 1 at positions H1 to H4 are illustrated by drawing out lines from the positions H1 to H4.

A width WX3 in the X direction of the low refractive index portion 206 at the position H3 is narrower than a width WX4 in the X direction of the low refractive index portion 206 at the position H4 located closer to the separating portion 109 than the position H3 (WX3<WX4). In this embodiment, the width of the low refractive index portion 206 in the X direction is narrowed monotonously as it becomes distant from the separating portion 109. However, the width may be narrowed stepwise or increase in the middle way. By setting the width of the low refractive index portion 206 to be narrowed at the position distant from the separating portion 109 to be narrowed, an amount of light incident on the low refractive index portion 206 may be reduced. Therefore, loss of light in the low refractive index portion 206 can be reduced, and a greater amount of light can be guided to the photoelectric conversion units 101 and 102.

The width in the X direction of the high refractive index portion 207 is narrowed as it becomes distant from the photoelectric conversion units 101 and 102 in the Z direction. The width T3 in the X direction of the high refractive index portion 207 (i.e., the first portion 2071 or the second portion 2072) at the position H3 is greater than the width T4 in the X direction of the high refractive index portion 207 at the position H4 located closer to the separating portion 109 than the position H3. In the present embodiment, the width in the X direction of the high refractive index portion 207 is increased monotonously as it becomes distant from the photoelectric conversion units 101 and 102, but the width may be increased stepwise or narrowed in the middle way. Thus, by increasing the width of the high refractive index portion 207 at the position distant from the photoelectric conversion units 101 and 102, a greater amount of light can be guided to the photoelectric conversion units 101 and 102.

Further, a width WY3 in the Y direction of the low refractive index portion 206 at the position H3 is greater than the width WX3 in the X direction of the low refractive index portion 206 at the same position H3. Similarly, a width WY4 in the Y direction of the low refractive index portion 206 at the position H4 is greater than the width WX4 in the X direction of the low refractive index portion 206 at the same position H4. Thus, by elongating the low refractive index portion 206 in the Y direction that is the direction in which the separating portion 109 extends, distribution accuracy of light in the light guide portion 111 may be improved. In the present embodiment, the cross-sectional shape of the low refractive index portion 206 at the position H3 or H4 is substantially elliptical. This is because the cross-sectional shape of the light guide portion 111 at the position H3 or H4 is circular. That is, the cross-sectional shape of the low refractive index portion 206 may be the compressed cross-sectional shape of the light guide portion 111 in the X direction. If the cross-sectional shape of the light guide portion 111 is substantially square, the cross-sectional shape of the low refractive index portion 206 may be substantially rectangular.

An intermediate portion 203 is located above the separating portion 109. A width in the X direction of the intermediate portion 203 is desirably the same as or narrower than the width in the X direction of the separating portion 109.

The intermediate portion 203 extends along the separating portion 109. At least a part of the intermediate portion 203 is located above the low refractive index portion 206. That is, in the X direction, the low refractive index portion 206 is located between the intermediate portion 203 and the separating portion 109. The intermediate portion 203 is a joint portion (i.e., a seam) of the high refractive index portion 207 (i.e., a first portion 2071) located above the photoelectric conversion unit 101, and the high refractive index portion 207 (i.e., the second portion 2072) located above the photoelectric conversion unit 102. The intermediate portion 203 may be made of the same material as that of the high refractive index portion 207 (i.e., the first portion 2071 and the second portion 2072) located above the photoelectric conversion units 101 and 102. However, the intermediate portion 203 is different from the high refractive index portion 207 (i.e., the first portion 2071 and the second portion 2072) located above the photoelectric conversion units 101 and 102 in, for example, density and composition. Therefore, when observed by, for example, the cross section SEM, the intermediate portion 203 may be observed with different brightness than that of the high refractive index portion 207 located above the photoelectric conversion units 101 and 102. Further, the intermediate portion 203 differs from the high refractive index portion 207 located above the photoelectric conversion units 101 and 102 in refractive index. Therefore, the intermediate portion 203 may function as a barrier against light between the high refractive index portion 207 located above the photoelectric conversion unit 101 and the high refractive index portion 207 located above the photoelectric conversion unit 102. The intermediate portion 203 may have a refractive index and density lower than those of the high refractive index portion 207 located above the photoelectric conversion units 101 and 102. The intermediate portion 203 desirably has a refractive index higher than that of the low refractive index portion 206. A recessed portion 205 is provided on the intermediate portion 203. Side surfaces of the recessed portion 205 may be formed by the high refractive index portion 207, and a bottom surface of the recessed portion 205 may be formed by the intermediate portion 203. Boundaries of the side surfaces and the bottom surface of the recessed portion 205 do not necessarily have to be clear. Instead, an inner surface of the recessed portion 205 may be formed only by the high refractive index portion 207, or may by formed only by the intermediate portion 203. The high refractive index film 113 or the low refractive index film 114 located above the light guide portion 111 may partially be located inside the recessed portion 205. The recessed portion 205 may function as a divergent lens when a member having a refractive index lower than the refractive index of the light guide portion 111 (e.g., the low refractive index film 114) is disposed thereinside. Therefore, light incident on the recessed portion 205 is distributed to the first portion 2071 or the second portion 2072 of high refractive index portion 207 avoiding the low refractive index portion 206, and is guided to the photoelectric conversion units 101 and 102. Thus, light utilization efficiency is improved.

The reference numeral 204 illustrated in FIG. 2 denotes a position at which a shielding member used in a manufacturing process described later is located. A shielding member 204 is used only in the manufacturing process, and is removed during the manufacturing process. But the shielding member 204 may remain as a part of the photoelectric conversion apparatus 10. The recessed portion 205, the intermediate portion 203, the low refractive index portion 206, and the separating portion 109 are located below the shielding member 204.

Figure 3:
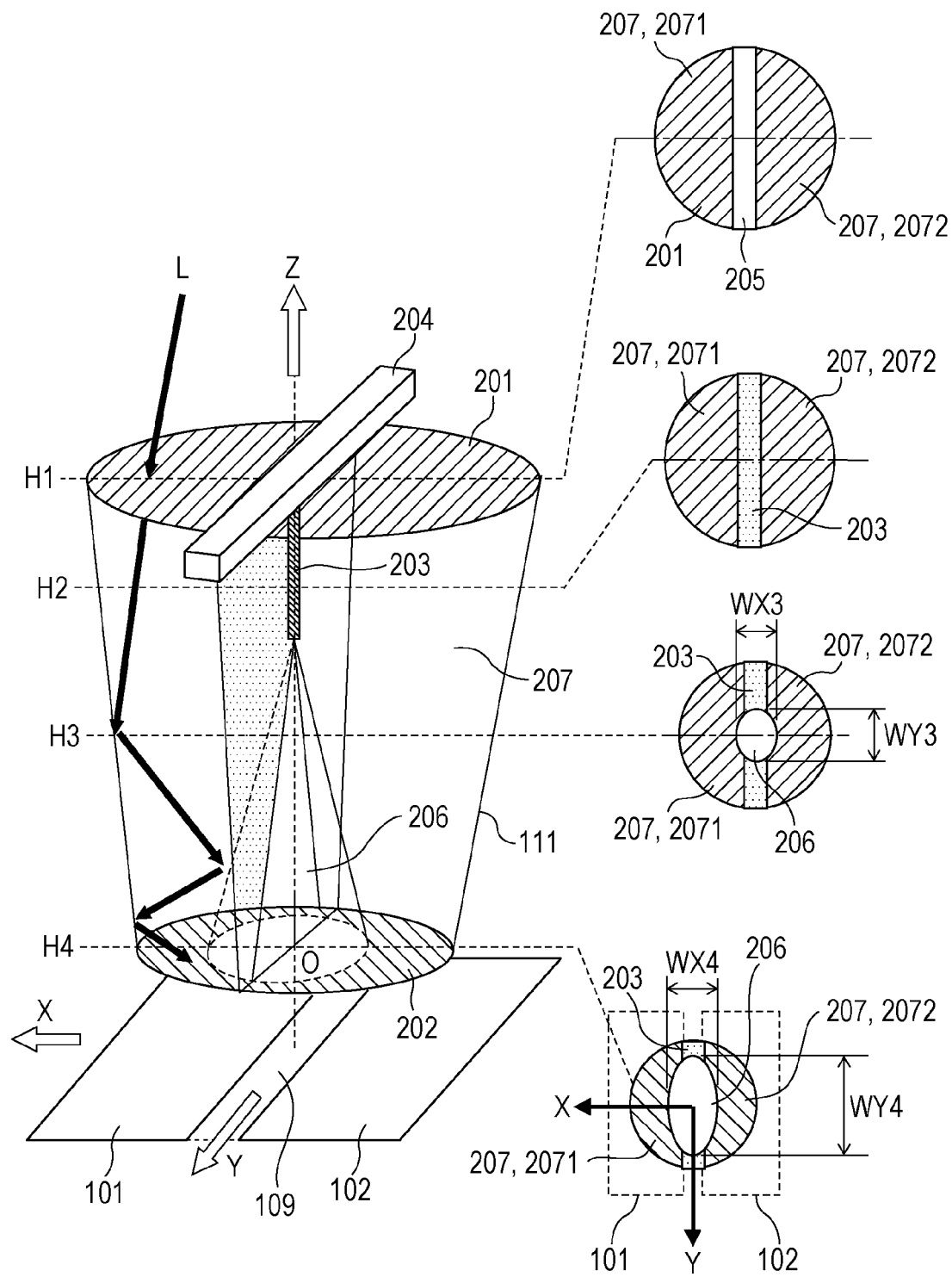
FIG. 3 is a schematic diagram illustrating a light-receiving element.

As illustrated in FIG. 3, in the Z direction, regarding a region above the separating portion 109, the low refractive index portion 206 does not exist in the region at the position H2, but the intermediate portion 203 occupies that region. At the position H1, neither the low refractive index portion 206 nor the intermediate portion 203 exists in the region but the recessed portion 205 occupies that region. As illustrated in FIG. 3, in the Y direction, the low refractive index portion 206 is sandwiched by the intermediate portion 203 at the position H3 located above the separating portion 109.

Next, a path of a light bundle in the light-receiving element 1 is described. The wave surface shape of the path of the light bundle inside the light-receiving element 1 is obtained by a physical optics simulation in consideration of the Fresnel diffraction. For the ease of understanding, geometrical-optical description of the path of the light bundle is provided.

Considering the size (0.1 to 10 μm) of the photoelectric conversion units 101 and 102, light enters into the photoelectric conversion apparatus 10 from an exit pupil of an image pickup lens (not illustrated) of the photoelectric conversion units 101 and 102 located at a far distant position. A light bundle L entering into a condensing portion 118 illustrated in FIG. 1A from a certain part (e.g., a right half) of the exit pupil passes through the wavelength selection unit 117 and the innerlayer lens 115 and follows an optical path illustrated by arrows in FIGS. 2 and 3. The light then enters into the first portion 2071 in the light guide portion 111. Similarly, a light bundle L' (not illustrated) entering into the condensing portion 118 of the light-receiving element 1 from another part of the exit pupil (e.g., a left half) of the image pickup lens enters into the second portion 2072 in the light guide portion 111. Thus, the exit pupil is divided by providing a plurality of photoelectric conversion units 101 and 102 in a single condensing portion.

The light bundle L is partially reflected on the intermediate portion 203, and is also reflected on an interface of the light guide portion 111 with the insulating film 110 and an interface between the high refractive index portion 207 and the low refractive index portion 206, and is guided to the photoelectric conversion unit 101 located at a lower portion. In the direction opposite to that described above, the light bundle L' is guided to the photoelectric conversion unit 102 located at a lower portion. The two light bundles subject to pupil division is separated into two by a partition wall formed by at least one of the intermediate portion 203 and the low refractive index portion 206 and is guided to the photoelectric conversion unit 101 or the photoelectric conversion unit 102. Thus, generation of crosstalking is reduced and the light can be distributed precisely to a plurality of photoelectric conversion units 101 and 102.

As described above, loss of light in the low refractive index portion 206 can be reduced by narrowing the width (WX3) of the upper portion than the width (WX4) of the lower portion of the low refractive index portion 206 sandwiched by the light guide portion 111. Therefore, light can be distributed suitably to a plurality of photoelectric conversion units while using the incident light effectively. Further, as illustrated in FIG. 3, since the shape of the high refractive index portion 207 is gradually changed from a semicircular shape to a crescent shape, the wave surface in the high refractive index portion 207 is also changed gradually, and the light reaches the photoelectric conversion unit 101 or the photoelectric conversion unit 102 located at the lower portion without being blocked. Therefore, loss of light within the high refractive index portion 207 is also reduced.

Figure 4A:
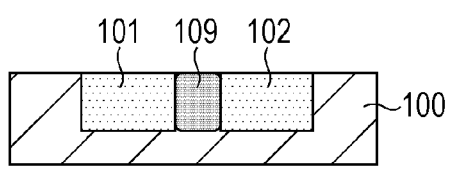
FIGS. 4A to 4H are schematic diagrams illustrating a manufacturing method of a photoelectric conversion apparatus.
Figure 4B:
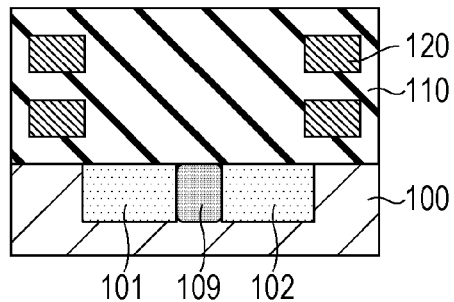
Figure 4C:
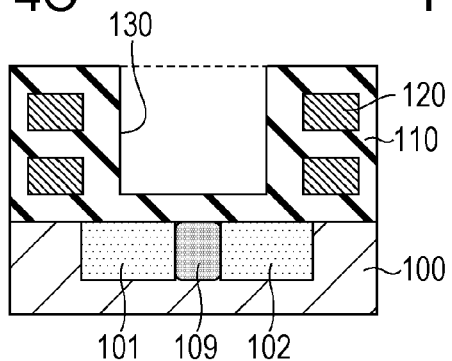
Figure 4D:
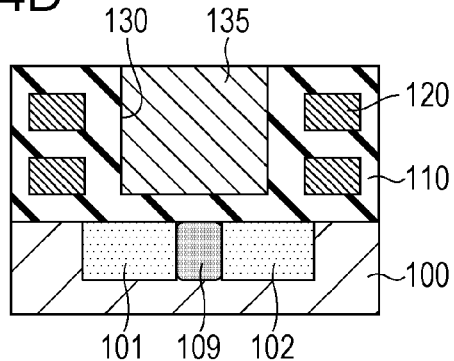
Figure 4E:
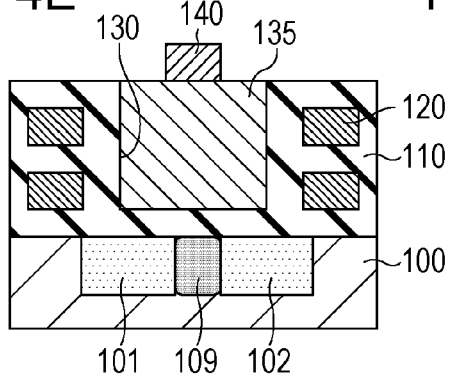
Figure 4F:
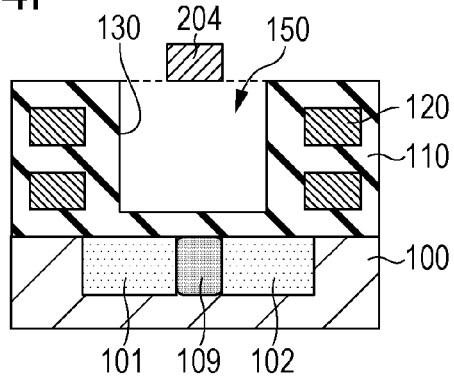
Figure 4G:
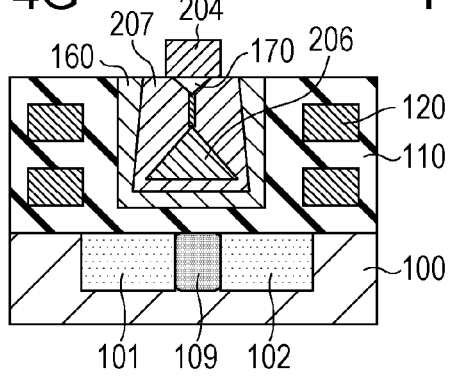

Next, a manufacturing method of the photoelectric conversion apparatus 10 having the configuration illustrated in FIGS. 2 and 3 is described with reference to FIGS. 4A to 4H. The substrate 100 on which a plurality of photoelectric conversion units 101 and 102 are arranged via the separating portion 109 is formed (FIG. 4A). Next, the insulating film 110 and the wiring 120 are formed on the substrate 100 by a multi-layer wiring process (FIG. 4B). An opening 130 is formed in the insulating film 110 at a position above the photoelectric conversion units 101 and 102 by etching the insulating film 110 avoiding the wiring 120 (FIG. 4C). A sacrifice member 135 is embedded in the opening 130, and an upper surface of the sacrifice member 135 is planarized if necessary (FIG. 4D). A member 140 that becomes a shielding member 204 is formed to extend from the upper surface of the sacrifice member 135 to an upper surface of the insulating film 110 (FIG. 4E). The member 140 may be formed by forming a film made of a material of the member 140 and then etching the film using a resist or patterning the film by the damascene processing. The member 140 is desirably patterned along the separating portion 109. Next, the sacrifice member 135 is removed from the opening 130. Then, a space 150 is formed below the member 140 and the member 140 becomes the shielding member 204 (FIG. 4F). The shielding member 204 is supported by a portion located above the insulating film 110, and takes a bridge girder shape. A material (i.e., the high refractive index material) that becomes the high refractive index portion 207 is made to deposit on the side surfaces and the bottom surface of the opening 130 in the presence of the shielding member 204. By continuously depositing the high refractive index material, the high refractive index portion 207 is formed. Supply of the high refractive index material is prevented by the shielding member 204 below the shielding member 204. Therefore, a void is formed in a region in which the high refractive index material is insufficient. This void becomes the low refractive index portion 206 (FIG. 4G). FIG. 4G illustrates a shape of a film (i.e., a high refractive index film 160) formed by a high refractive index material in the middle of formation of the high refractive index portion 207. Deposition proceeds anisotropically on the side surfaces and the bottom surface of the opening 130. Specifically, since deposition on the side surfaces of the opening 130 proceeds more quickly than on the bottom surface, at the upper portion of the opening 130, the opening 130 is closed with the void being formed. Since supply of the material of the high refractive index is insufficient immediately below the shielding member 204, a void 170 is also formed immediately below the shielding member 204. Below the void 170, the high refractive index material deposits on the side surfaces facing in the X direction in the opening 130 and the distance between the deposited high refractive index materials on the facing side surfaces becomes shorter. Then the intermediate portion 203 is formed when the deposited high refractive index materials on the facing side surfaces are brought into contact with each other. The shorter the distance between the deposited high refractive index materials on the facing side surfaces becomes, the smaller the amount of supply of the material (i.e., gas) of the high refractive index material becomes. Therefore, the density of the intermediate portion 203 is considered to be smaller compared with the density of other portions (i.e., the high refractive index portion 207) made of the same high refractive index material.

Figure 4H:
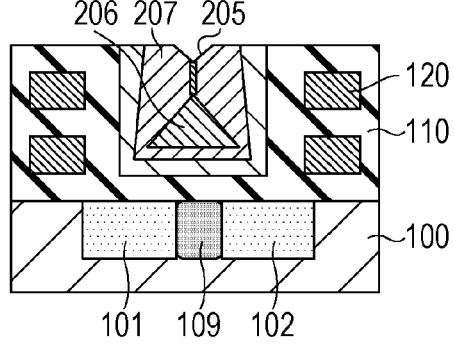

Then, the shielding member 204 is removed (FIG. 4H). The shielding member 204 may be left unremoved, but it is desirable to remove the shielding member 204 because existence of the shielding member 204 produces loss and scattering of light. For the removal of the shielding member 204, dry etching or wet etching may be used. Mechanical removing methods, such as the CMP method, may also be employed. An upper portion of the void 170 located immediately below the shielding member 204 is released when the shielding member 204 is removed, and the recessed portion 205 is formed.

The material of the shielding member 204 is desirably not to be easily sputtered in the process of embedding the high refractive index material in the opening 130 (FIG. 4G) so that metal contaminants do not spread in the photoelectric conversion units 101 and 102 located at the lower portion. Specifically, when the high refractive index material is deposited by plasma CVD, especially desirable materials are tungsten, tantalum, and the like, which are high melting point metals, and their compounds. When the high refractive index portion 207 is formed by application or reflowing, resin having both chemical resistance and heat resistance, or inorganic materials, such as a silicon nitride film, a silicon oxide film, alumina, and titanium oxide, are desirably used for the shielding member 204.

Figure 5A:
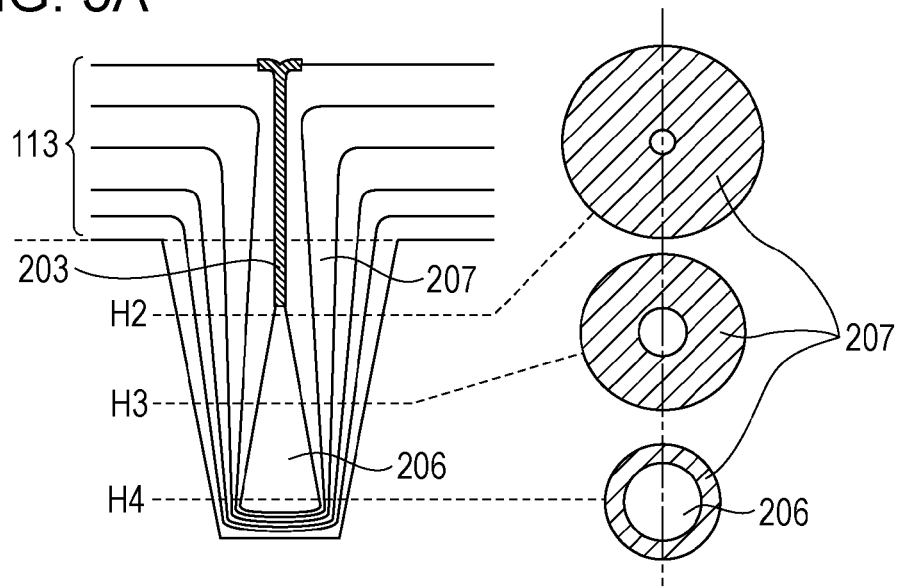
FIGS. 5A to 5D are schematic diagrams illustrating a light-receiving element.

FIG. 5A illustrates an example in which the shielding member 204 is not used. With the deposition of the high refractive index material on the inner surface of the opening 130, the low refractive index portion 206 as the void is formed. The width of the low refractive index portion 206 is narrower at the position H3 than at the position H4, and at the position H2 than at the position H3. This is because the most part of the material (i.e., gas) of the high refractive index material is consumed near the entrance of the opening 130 and becomes the high refractive index material, and therefore the amount of the material that reaches near the bottom portion of the opening 130 becomes relatively small. That is, depending on the amount of supply of the high refractive index material, the thickness of the high refractive index film formed by deposition becomes larger near the entrance of the opening 130, and becomes smaller near the bottom of the opening 130.

As described above, the width in the X direction of the low refractive index portion 206 can be varied along the positions in the Z direction even if the shielding member 204 is not used. However, when the shielding member 204 is not used, controlling the cross-sectional shape of the low refractive index portion 206 at the position H3 or the position H4 is difficult. Specifically, at the position H3, the width WX3 in the X direction and the width WY3 in the Y direction of the low refractive index portion 206 are the same (WX3=WY3). Similarly, at the position H4, the width WX4 in the X direction and the width WY4 in the Y direction of the low refractive index portion 206 are the same (WX4=WY4). This is because the high refractive index material is deposited isotropically on the side walls of the opening 130. When the cross-sectional shape of the opening 130 vertical to the Z direction is circular, the cross-sectional shape of the low refractive index portion 206 vertical to the Z direction is also circular. Alternatively, the shape of the opening 130 may be changed into a cross-sectional shape that is longer in the Y direction than in the X direction, such as elliptical or rectangular. Then, regarding the shape of the low refractive index portion 206, the width WY3 and the width WY4 in the Y direction can be set to be greater than the width WX3 and the width WX4 in the X direction even if the shielding member 204 is not used. In this method in which the shape of the opening 130 is controlled, however, the shape of the high refractive index portion 207 can be disadvantageous to the improvement in sensitivity or distribution of light. Therefore, it is desirable to control the shape of the low refractive index portion 206 using the shielding member 204.

Figure 5B:
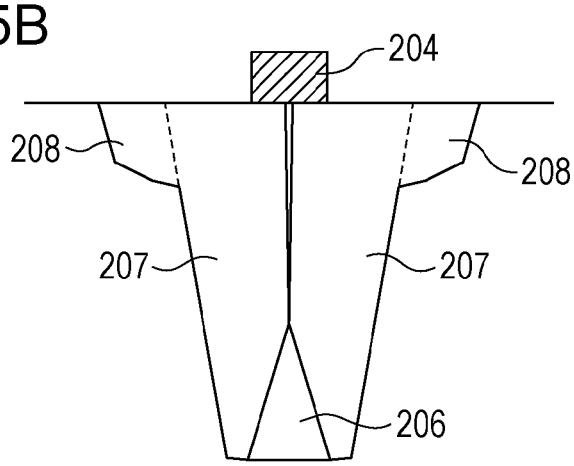

FIG. 5B illustrates a configuration in which the diameter of the opening 130 has been increased discontinuously near the entrance of the opening 130. This configuration improves embeddability of the high refractive index material in the opening 130. The height of the low refractive index portion 206 is reduced accordingly and loss of light by the low refractive index portion 206 can be reduced.

Figure 5C:
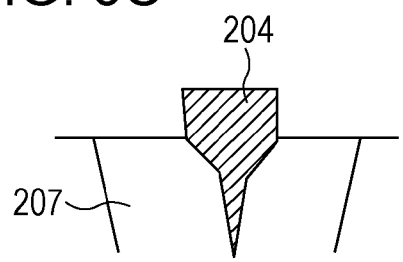
Figure 5D:
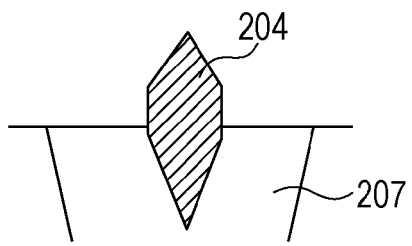

FIGS. 5C and 5D illustrate examples in which the shape of the shielding member 204 is changed. A lower surface of the shielding member 204 projects downward. After the shielding member 204 is removed, a recessed portion 205 conforming to the shape of the lower surface of the shielding member 204 is transferred to the high refractive index portion 207. In the example of FIG. 5D, an upper surface of the shielding member 204 projects upward. This shape does not prevent the high refractive index material deposited on the shielding member 204 from being embedded in the opening 130. In the example of FIG. 5D, even if the shielding member 204 is left unremoved, reflected light on the upper surface of the shielding member 204 is guided to the light guide portion 111. Therefore, even if the shielding member 204 is left unremoved, loss of light by the shielding member 204 can be reduced.

Figure 6:
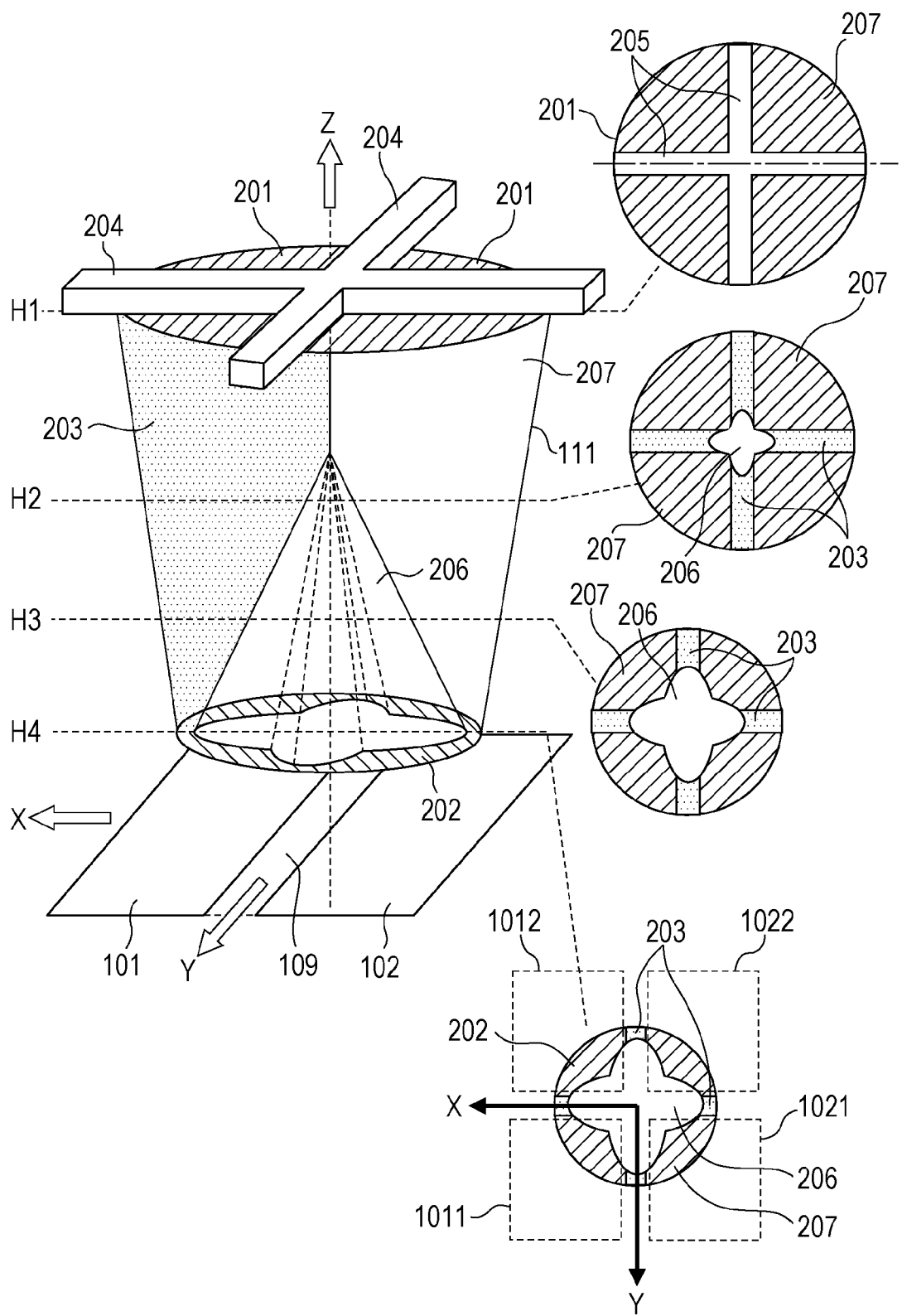
FIG. 6 is a schematic diagram illustrating a light-receiving element.

The number of photoelectric conversion units included in a single light-receiving element 1 may be three or more. The lower right diagram of FIG. 6 illustrates a form in which four photoelectric conversion units 1011, 1021, 1012, and 1022 that are separated from one another via a separating portion are provided in a single light-receiving element 1. The photoelectric conversion unit 1011 and the photoelectric conversion unit 1012 illustrated in the lower right diagram of FIG. 6 are disposed via a separating portion (not illustrated) in the region illustrated as the photoelectric conversion unit 101 in the left diagram of FIG. 6. The photoelectric conversion unit 1021 and the photoelectric conversion unit 1022 in the lower right diagram of FIG. 6 are disposed via a separating portion (not illustrated) in the region illustrated as the photoelectric conversion unit 102 in the left diagram of FIG. 6. The light guide portion 111 included in a single light-receiving element 1 may be twice rotationally symmetrical about an axis parallel to the Z direction as illustrated in FIG. 3, or may be four times rotationally symmetrical about an axis parallel to the Z direction as illustrated in FIG. 6. The separating portion 109 has a substantially cross shape, and the shielding member 204 has a substantially cross shape to conform to the separating portion 109. Since the shielding member 204 has a substantially cross shape, the low refractive index portion 206 also has a substantially cross shaped cross section on a surface vertical to the Z direction. The recessed portion 205 also has a substantially cross shape. In the X direction in which the photoelectric conversion unit 1011 and the photoelectric conversion unit 1021, and the photoelectric conversion unit 1012 and the photoelectric conversion unit 1022 are arranged next to each other, the width of the low refractive index portion 206 is narrowed as it becomes distant from the separating portion 109. In the Y direction in which the photoelectric conversion unit 1011 and the photoelectric conversion unit 1012, and the photoelectric conversion unit 1021 and the photoelectric conversion unit 1022 are arranged next to each other, the width of the low refractive index portion 206 is greater than the width in the X direction.

The embodiment described above is summarized as follows. The light-receiving element 1 of the photoelectric conversion apparatus 10 includes the photoelectric conversion unit 101 and the photoelectric conversion unit 102, and the separating portion 109 located between the photoelectric conversion unit 101 and the photoelectric conversion unit 102. The light-receiving element 1 includes the light guide portion 111 that is surrounded by an insulating film 110 including at least one insulating layer 1105, and is provided to extend over the photoelectric conversion unit 101 and the photoelectric conversion unit 102. The direction in which the photoelectric conversion unit 101 and the photoelectric conversion unit 102 are arranged is defined as the X direction, the direction in which the photoelectric conversion unit 101 and the photoelectric conversion unit 102, and the light guide portion 111 are arranged is referred to as the Z direction. The light guide portion 111 includes the low refractive index portion 206 and the high refractive index portion 207. The low refractive index portion 206 has a refractive index equal to or lower than that of the insulating layer 1105. The high refractive index portion 207 has a refractive index higher than that of the low refractive index portion 206. The low refractive index portion 206 is located above the separating portion 109, and is sandwiched by the high refractive index portion 207 in the X direction. The width WX3 in the X direction of the low refractive index portion 206 at the position H3 distant from the separating portion 109 in the Z direction is narrower than the width WX4 in the X direction of the low refractive index portion 206 at the position H4 located closer to the separating portion 109 than the position H3 in the Z direction. When a direction vertical to the X direction and the Z direction is defined as a Y direction, the width WY3 in the Y direction of the low refractive index portion 206 at the position H3 is greater than the width WX3 in the X direction of the low refractive index portion 206 at the same position H3. With this configuration, light can be distributed suitably to a plurality of photoelectric conversion units while using the incident light effectively.

According to the present technique, light can be distributed suitably to a plurality of photoelectric conversion units while using the incident light effectively.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-123832, filed Jun. 16, 2014 which is hereby incorporated by reference herein in its entirety.

What is claimed is:

1. A photoelectric conversion apparatus including a light-receiving element, the light-receiving element comprising:
   a first photoelectric conversion unit and a second photoelectric conversion unit;
   a separating portion located between the first photoelectric conversion unit and the second photoelectric conversion unit; and
   a light guide portion surrounded by an insulating film including at least one insulating layer, and provided to extend over the first photoelectric conversion unit and second photoelectric conversion unit,
   wherein when a direction in which the first photoelectric conversion unit and the second photoelectric conversion unit are arranged is defined as a first direction, and a direction in which the first photoelectric conversion unit and the second photoelectric conversion unit, and the light guide portion are arranged is defined as a second direction, the light guide portion includes a low refractive index portion and a high refractive index portion, the low refractive index portion having a refractive index equal to or lower than a refractive index of the insulating layer, and the high refractive index portion having a refractive index higher than a refractive index of the low refractive index portion, the low refractive index portion is located above the separating portion, and is sandwiched by the high refractive index portion in the first direction, and a width in the first direction of the low refractive index portion at a first position distant from the separating portion in the second direction is narrower than a width in the first direction of the low refractive index portion at a second position closer to the separating portion than the first position in the second direction.

2. The photoelectric conversion apparatus according to claim 1, wherein when a direction vertical to the first direction and the second direction is defined as the third direction, a width in the third direction of the low refractive index portion at the first position is greater than the width in the first direction of the low refractive index portion at the first position.

3. The photoelectric conversion apparatus according to claim 1, wherein the high refractive index portion has a refractive index higher than the refractive index of the insulating layer.

4. The photoelectric conversion apparatus according to claim 1, wherein the low refractive index portion is constituted by gas or a vacuum space.

5. The photoelectric conversion apparatus according to claim 1, wherein the low refractive index portion is disposed between the high refractive index portion and the separating portion in the third direction.

6. The photoelectric conversion apparatus according to claim 1, wherein the light-receiving element further includes a third photoelectric conversion unit located next to the first photoelectric conversion unit in the second direction, and a fourth photoelectric conversion unit located next to the second photoelectric conversion unit in the second direction; and a cross-sectional shape of the low refractive index portion in the first direction at the second position is a cross shape.

7. A manufacturing method of the photoelectric conversion apparatus according to claim 1, the method comprising:
 forming a member above an opening provided in the insulating film, and
 causing a material that becomes the high refractive index portion to be deposited in the opening using the member as a shielding member, thereby forming the low refractive index portion below the shielding member.

8. The manufacturing method of the photoelectric conversion apparatus according to claim 7, wherein in the process of forming the member above the opening, a sacrifice member is formed in the opening, the member that becomes the shielding member is formed above the sacrifice member, and the sacrifice member is removed.

9. An image pickup system provided with the photoelectric conversion apparatus according to claim 1, wherein the image pickup system performs image pickup and focus detection based on signals obtained by the light-receiving element.

* * * * *